United States Patent
Lemkin et al.

(10) Patent No.: US 8,558,728 B1
(45) Date of Patent: Oct. 15, 2013

(54) PHASE NOISE TOLERANT SAMPLING

(75) Inventors: Mark Alan Lemkin, Berkeley, CA (US); Thor Nelson Juneau, Menlo Park, CA (US)

(73) Assignee: Dust Networks, Inc., Hayward, CA (US)

(*) Notice: Subject to any disclaimer, the term of this patent is extended or adjusted under 35 U.S.C. 154(b) by 0 days.

(21) Appl. No.: 13/559,909

(22) Filed: Jul. 27, 2012

(51) Int. Cl.
*H03M 1/50* (2006.01)

(52) U.S. Cl.
USPC .......................................... 341/166; 341/155

(58) Field of Classification Search
USPC .................................................. 341/155, 166
See application file for complete search history.

(56) References Cited

U.S. PATENT DOCUMENTS

| | | | | |
|---|---|---|---|---|
| 6,429,693 | B1* | 8/2002 | Staszewski et al. | 327/12 |
| 7,304,510 | B2* | 12/2007 | Matsuta | 327/3 |
| 7,332,973 | B2* | 2/2008 | Lee et al. | 331/25 |
| 7,710,835 | B2* | 5/2010 | Kim et al. | 368/120 |
| 7,804,290 | B2* | 9/2010 | Henzler et al. | 324/76.82 |
| 7,884,751 | B2* | 2/2011 | Shimizu et al. | 341/166 |
| 7,916,064 | B2* | 3/2011 | Lin et al. | 341/166 |
| 8,064,561 | B2* | 11/2011 | Henzler | 375/371 |
| 8,106,808 | B1* | 1/2012 | Cohen et al. | 341/166 |
| 8,138,843 | B2* | 3/2012 | Straayer et al. | 331/57 |
| 8,138,958 | B2* | 3/2012 | Dai et al. | 341/155 |

OTHER PUBLICATIONS

R. Su., et al., "A 900MHz and a 2.4GHz Fractional-N AIII-Digital PLLs Built with Standard Cells," 8 pages.
P. Dudek et al., "A High-Resolution CMOS Time-to-Digital Converter Utilizing a Vernier Delay Line," IEEE Transactions on Solid-State Circuits, vol. 35, No. 2, Feb. 2000, 8 pages.
Richard Yu-Kuwan Su, Towards a Synthesizable Standard-Cell Ratio, Fall 2011, 97 pages.

* cited by examiner

*Primary Examiner* — Khai M Nguyen
(74) *Attorney, Agent, or Firm* — McDermott Will & Emery LLP

(57) ABSTRACT

Phase noise in a first clock signal is measured using a time to digital converter (TDC) by determining variations in the phase delay between the first clock signal and a second clock signal. The TDC can include first and second series interconnections of delay elements, first and second sets of latches, and processing circuitry coupled to the latches and configured to determine the phase delay. The TDC can include a series interconnection of delay elements, latches, and circuitry configured to selectively adjust the control signal connected to the delay elements based on the output of the latches. The phase noise measurement can be used in a sampling circuit, so as to produce a second data signal from a first data signal based on the first clock signal and the measured phase noise.

27 Claims, 12 Drawing Sheets

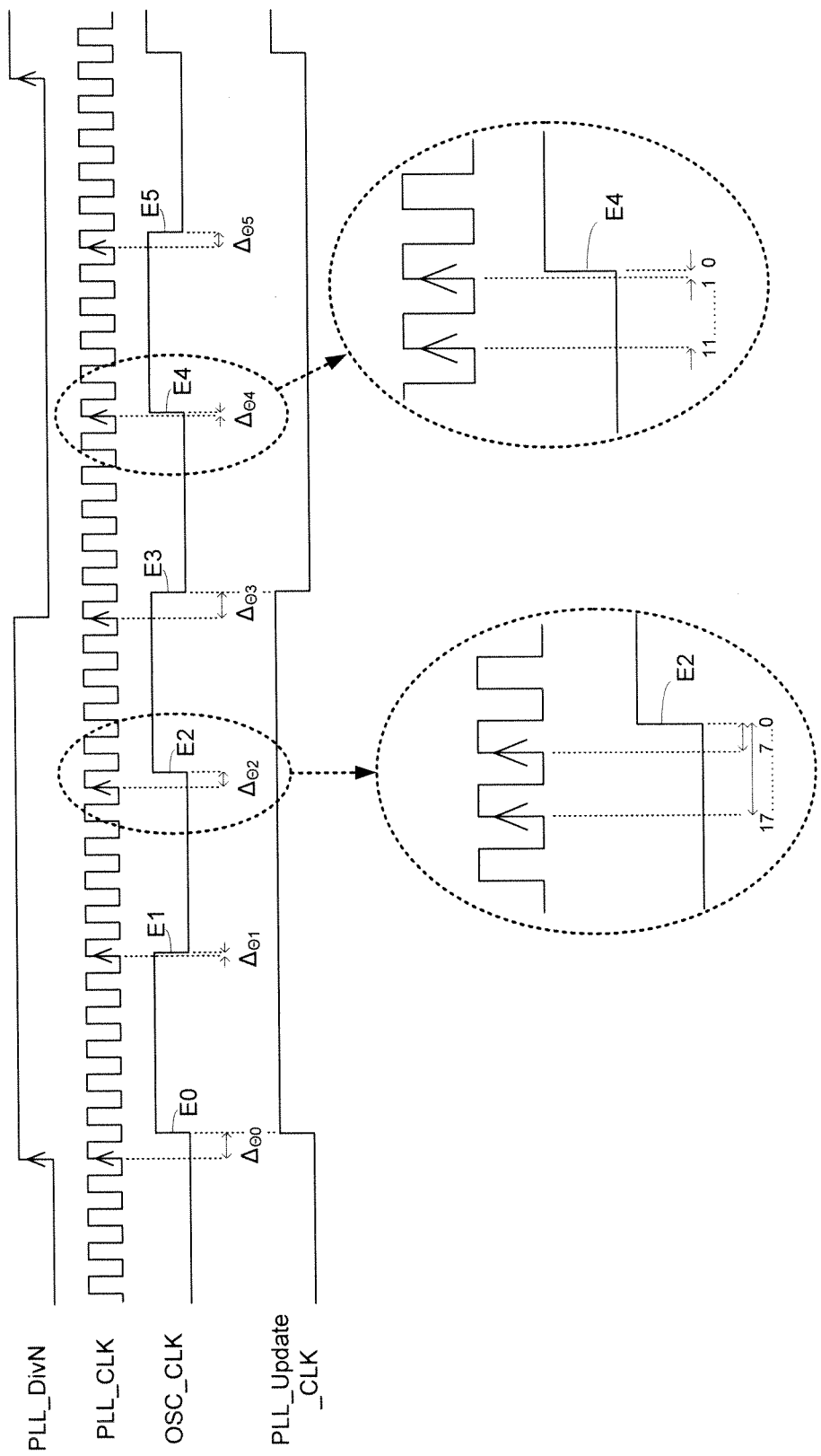

PHASE NOISE TOLERANT SAMPLING

FIELD OF THE INVENTION

The present subject matter relates to techniques and equipment to measure phase noise in a clock signal, and to provide phase-noise tolerant sampling by removing the measured phase noise from the clock signal used for sampling, or by correcting a sampled signal using the measured phase noise.

BACKGROUND

A modern radio receiver, such as the radio receiver 100 shown in FIG. 1A, includes a demodulator 101 which utilizes a phase-locked loop (PLL) 102 including a voltage controlled oscillator (VCO) 103 to demodulate an analog RF input signal received at antenna 104 by projecting the RF input signal onto a rotating orthogonal basis comprising an in-phase (I) and a quadrature-phase (Q) coordinate system. Projection is accomplished by first multiplying, using a multiplier 105, the incoming signal by the local oscillator signal $\cos(2\pi \cdot f_{PLL} \cdot t)$ to obtain the in-phase component I of the RF signal, and filtering the resulting signal using a low-pass filter 109. Similarly, projection of the quadrature component of the RF input signal is obtained by multiplying, using a multiplier 107, the incoming signal by an orthogonal, 90-degree phase-shifted output of the local oscillator $\sin(2\pi \cdot f_{PLL} \cdot t)$, wherein the 90 degree phase shift is with respect to the frequency of the PLL 102, and filtering the resulting signal using a low-pass filter 111. The resulting signals can be provided as input to analog-to-digital (A/D) converters 115, 117 for further processing, before being output from outputs 119a and 119b of the receiver 101. Once the RF signal has been projected onto the I/Q coordinate system amplitude and/or phase information is available since the pair of coordinates [I,Q] specify a unique vector from the origin to the measured coordinates. A transformation also may be used to convert I/Q pair into an r, theta basis function which is also an orthogonal basis. To ensure proper demodulation, it is necessary to accurately distinguish where sampled data points lie in the coordinate system as the location on the coordinate system at a given instant in time is the fundamental basis by which symbols are differentiated from one another.

Most modern I/Q radio-receiver mixers (e.g., multipliers 105 and 107 of demodulator 101) are driven by amplitude-limited drivers—for example a rail-to-rail signal generated by one or more inverters or a buffer is often used to drive mixer switches. Thus, amplitude noise of the local oscillator is of relatively little consequence since amplitude noise is regenerated out of the demodulation signal by the time the demodulation signal reaches the mixer switches. Phase noise, on the other hand, may be considerable because the phase noise has no such mechanism to restore the phase to ideal in the face of disturbances except the PLL. As a result, phase noise in a clock signal PLL_CLK provided by a PLL 102 to a demodulator 101 is generally not attenuated, and results in noise in the demodulated signal at output 119 of the demodulator 101. Referring to FIG. 1B, the PLL is updated at a rate (i.e. a PLL update frequency) which is generated (either directly or using a divided down version) from a stable oscillation signal OSC_CLK such as provided by a quartz crystal oscillator (e.g., oscillator 113 of FIG. 1A). The PLL attenuates phase noise from the VCO below the bandwidth of the PLL, performing no such attenuation for signals above the PLL loop bandwidth. To ensure PLL stability, the bandwidth of the PLL is generally chosen to be substantially lower than the PLL update frequency (generally 5-10× lower). Thus, the PLL attenuates only close-in phase noise signals, with a bandwidth often many times lower than the frequency of the oscillator signal OSC_CLK. When an integer-N PLL is used, the PLL update frequency may be constrained to be lower than otherwise desirable due to channel-spacing requirements. In general, the PLL output signal PLL_CLK has a higher frequency than the oscillator signal OSC_CLK (e.g., OSC_CLK has a frequency that is a ratio of integers M/N times higher than the PLL_CLK frequency), and a divided-down version of the PLL output signal PLL_CLK (e.g., divided by an integer N) may thus be used for edge comparison with a divided-down version of the oscillator signal (e.g., divided by an integer M) as shown in FIG. 1B.

Referring to FIG. 1C, a VCO is shown with a first phase-noise characteristic (such as provided by a L-C oscillator) with (154) and without (152) a PLL having a bandwidth of 100 kHz. Referring to FIG. 1D, a VCO is shown with a noisier phase-noise characteristic (such as provided by a ring-oscillator) with (158) and without (156) a PLL bandwidth of 100 kHz. As can be seen by comparison of the two characteristics, the phase noise of the LC oscillator is substantially lower than the phase noise of the open-loop VCO comprising a ring oscillator, and substantially lower than the phase noise of the closed-loop PLL VCO comprising a ring oscillator even within the bandwidth of the PLL. When the phase-locked loop VCO is used to drive mixer switches of a radio mixer or initiate a sampling operation in an analog-to-digital converter (ADC), the phase noise causes timing jitter. Timing jitter results in a decrease in the output-signal fidelity because the jitter causes the desired signal to be modulated, thereby converting a portion of the desired energy into noise. This noise has the effect of increasing the error vector magnitude (EVM) of the symbol constellation generated at the mixer outputs from the I/Q demodulated data, since phase noise causes the orthogonal basis functions to deviate from a constant rotation rate. Similar deleterious behaviors are observed in sampling of a signal by a stand-alone ADC.

The phase noise is generally specified as dB with respect to the energy at the fundamental frequency at a given frequency offset from the carrier. The noise is generated from various stochastic and deterministic sources including thermal noise, flicker noise, shot noise, and power-supply or reference noise. The phase noise of an oscillator may be reduced by increasing the amount of energy stored in the oscillator thereby attenuating the relative effects of the various noise sources. Increasing the total VCO energy often requires use of an inductor, which is large in terms of area. The design choice of using an inductor for the VCO comes with the additional disadvantage that a large amount of power must be consumed by the VCO to maintain oscillation at the desired energy/loss ratio. Furthermore, use of an inductor-based VCO exposes the device to susceptibility to electromagnetic interference from external sources, such as an on-board or on-chip DCDC converter comprising an inductor.

A noisy but otherwise acceptable VCO may be formed in a 65 nm process using a three tap ring oscillator. To give an idea of the performance of such a ring oscillator simulations were run yielding a 5.8 GHz ring oscillator that draws 25 uA from a 0.8V supply (corresponding to a power consumption of 20 uW) and has a phase noise of −66 dB/Hz at 1 MHz offset. Note, however, that the phase noise of the ring oscillator is substantially higher than the phase noise of the LC oscillator. Conventional techniques would require a ring oscillator to run at a much higher current and/or use of a very high bandwidth PLL to suppress in-band phase noise. Both of these choices cause dramatic increase in power consumption.

Finally, in some embodiments even the use of an inductor-based VCO yields inadequate phase noise performance.

A need therefore exists for systems and methods for providing PLLs and VCOs having reduced phase noise or jitter without requiring a substantial increase in circuit power consumption.

SUMMARY

The teachings herein alleviate one or more of the above noted problems with various systems and methods for measuring phase noise in clock signals, and providing phase noise tolerant sampling.

A first illustrative system includes a time to digital converter (TDC) and associated processing circuitry. The TDC includes a first series interconnection of a plurality of delay elements, wherein a first delay element of the first series interconnection receives a first timing signal at an input; a first plurality of latches, wherein each latch of the first plurality of latches has an input connected to an output of a respective delay element of the first series interconnection, and each latch of the first plurality of latches receives a second timing signal at a clock input; a second series interconnection of a plurality of delay elements, wherein a first delay element of the second series interconnection receives the first timing signal at an input; and a second plurality of latches, wherein each latch of the second plurality of latches has an input connected to an output of a respective delay element of the second series interconnection, and each latch of the second plurality of latches receives the second timing signal at a clock input. The processing circuitry is coupled to the outputs of the first and second pluralities of latches and is configured to determine an approximate phase delay between the first timing signal and the second timing signal based on outputs of the first and second pluralities of latches.

A second illustrative system includes a series interconnection of a plurality of delay elements, wherein a first delay element of the series interconnection receives a first timing signal at an input, and each delay element of the series interconnection has a first delay period and is connected to a control signal; a plurality of latches, wherein each latch of the plurality of latches has an input connected to an output of a respective delay element of the series interconnection, and each latch of the plurality of latches receives a second timing signal at a clock input; and circuitry configured to selectively adjust the control signal connected to the delay elements of the first series interconnection based on an output of the plurality of latches.

A third illustrative system includes a phase-locked look (PLL), a phase noise measurement unit, and a sampling circuit. The PLL receives an oscillator clock signal at an input, and produces a PLL clock signal at an output. The phase noise measurement unit respectively receives at first and second inputs the oscillator clock signal and the PLL clock signal, and is configured to produce a phase noise signal indicative of phase noise between the oscillator clock and PLL clock signals. The sampling circuit is configured to convert a first data signal into a second data signal, wherein the sampling circuit receives the PLL clock signal and the phase noise signal, and converts the first data signal into the second data signal based on the PLL clock signal and the phase noise signal.

An illustrative method includes generating a PLL clock signal in a phase-locked loop (PLL) receiving an oscillator clock signal; measuring a phase delay between the PLL clock signal and the oscillator clock signal; comparing the measured phase delay with a baseline phase delay, and producing a phase noise signal indicative of the difference between the measured phase delay and the baseline phase delay; and converting a first data signal into a second data signal using the PLL clock signal and the phase noise signal.

Additional advantages and novel features will be set forth in part in the description which follows, and in part will become apparent upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 5 is a timing diagram of illustrative signals propagating in phase noise measurement and correction circuitry.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various systems and methods disclosed herein relate to the measurement of phase noise or jitter between a reference clock signal provided by an oscillator and a PLL clock signal at an output of a PLL/VCO, and the provision of a corrected timing reference signal or the correction of a sampled signal using the measured phase noise.

Reference now is made in detail to the examples illustrated in the accompanying drawings and discussed below. The systems and methods described herein addresses the problem of rejection of phase noise from a sampling clock (e.g. a sampling clock provided at an output of a PLL/VCO) by measuring the phase error of the sampling clock PLL_CLK with respect to a reference oscillator clock signal OSC_CLK, and compensating for the phase error (jitter) of the sampling clock before or after sampling has occurred. Phase error can be measured at the moment of sampling, can be measured at a time shifted from the moment of sampling, or can be averaged to account for the effect of dynamics or delay in the path between a sampling switch input and the sampled signal (e.g. a mixer output may be filtered before being sampled by an ADC; thus the phase noise which causes signal corruption occurred some time prior to the ADC sample characterized by the group delay of the signal path). In this manner a post-sampling phase correction may be applied to the sample thereby removing the deleterious effect of the phase noise. The teachings described herein apply equally to radio systems, ADC sampling, and any other appropriate system which is sampled by a signal the performance of which is adversely affected by phase noise.

Figure 1A:
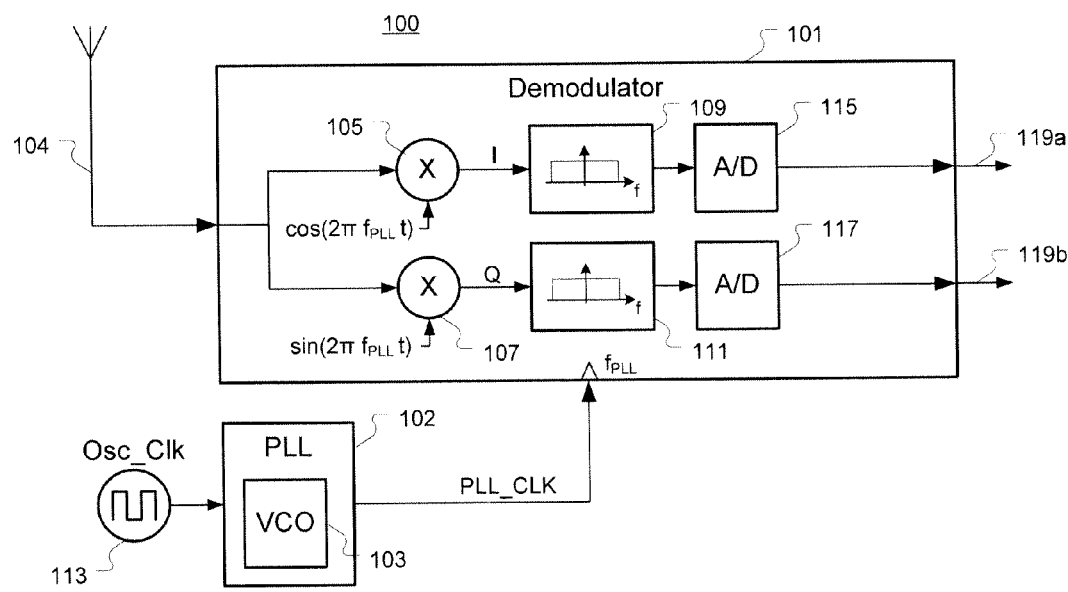
FIG. 1A is a block diagram illustratively showing a standard radio receiver including a demodulator receiving a clock signal from a phase-locked loop (PLL).
Figure 1B:
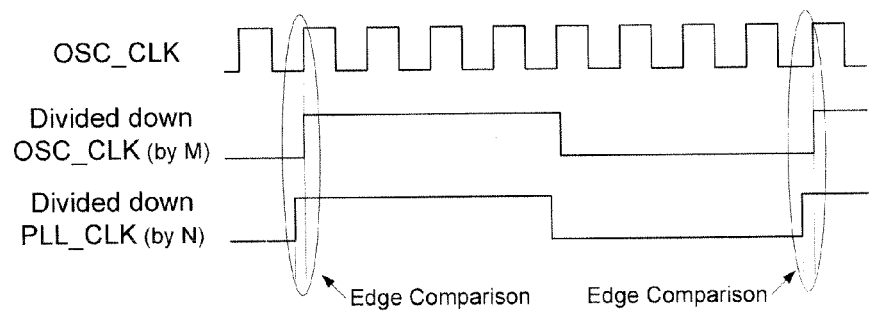
FIG. 1B is a timing diagram of illustrative signals propagating in the radio receiver of FIG. 1A.
Figure 1C:
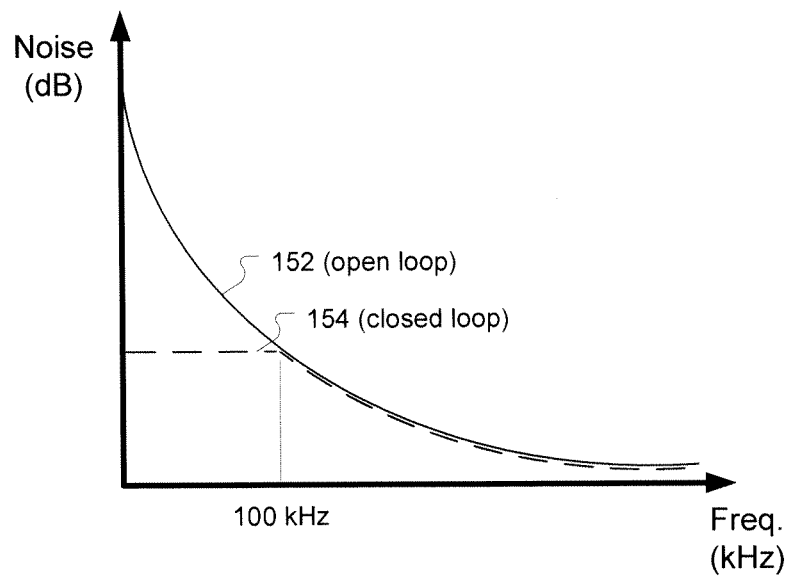
FIGS. 1C and 1D are illustrative plots showing phase-noise characteristics of different types of oscillators.
Figure 1D:
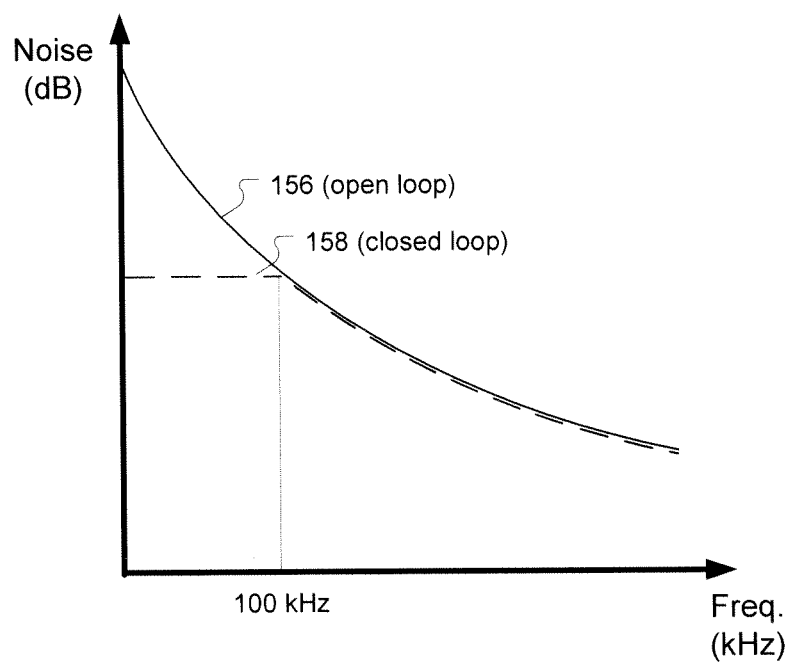
Figure 2A:
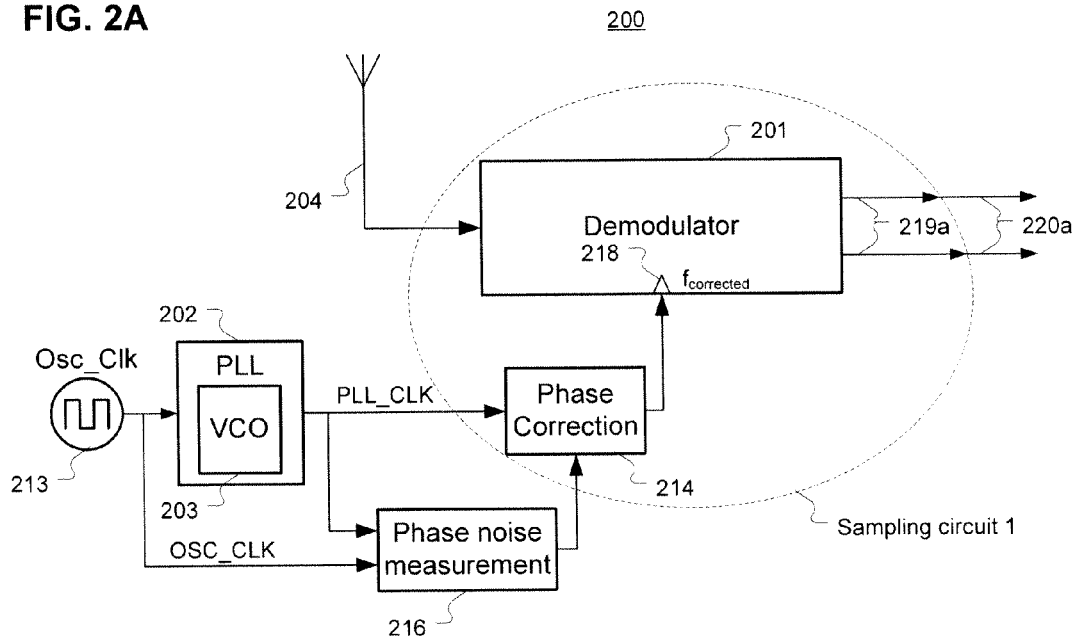
FIGS. 2A and 2B are block diagrams of illustrative systems used to measure phase noise in a clock signal and correct sampling performed based on the clock signal.
Figure 2B:
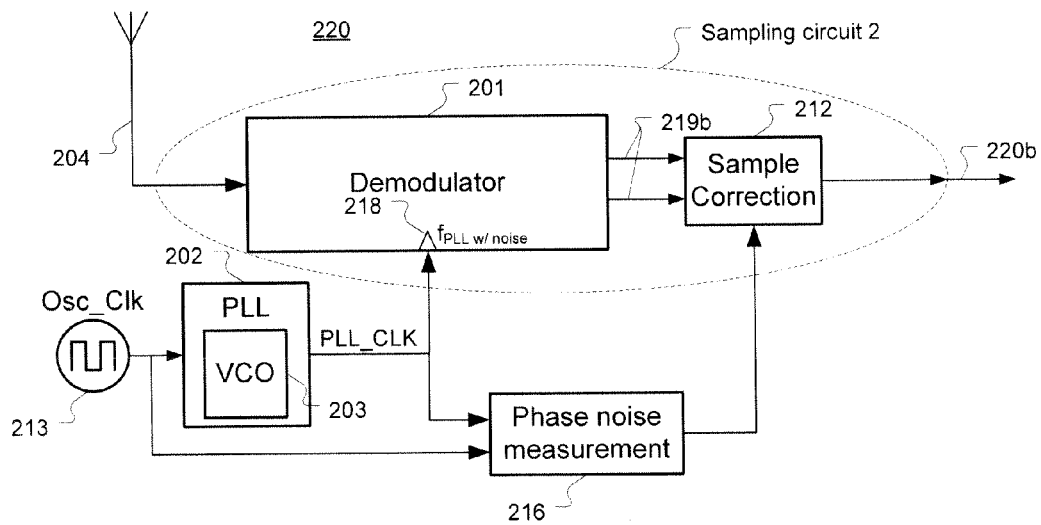

FIGS. 2A and 2B show illustrative block diagrams of systems 200 and 220 used to measure phase noise in a sampling clock. The system 200 uses the phase noise measurement to remove phase noise from the sampling clock, and to provide a corrected sampling clock signal to a demodulator. The demodulator of system 200 can thus provide a demodulated signal that is less affected by phase noise than a similar demodulated signal provided by the system 100. The system 220 uses the phase noise measurement to correct samples at the output of a demodulator, so as to provide a corrected demodulated signal that is less affected by phase noise.

The systems 200 and 220 shown in FIGS. 2A and 2B each include a demodulator 201 receiving a RF input signal from an antenna 204, and respectively producing a demodulated signal at outputs 219a/219b of the demodulator. In some embodiments the demodulator includes a mixer driven by the sampling clock. The demodulation is performed based on a sampling clock received at a clock input 218 of the demodulator 201. A PLL 202 including a VCO 203 receives a reference clock signal OSC_CLK from an oscillator 213 (e.g., a quartz crystal oscillator), and produces a PLL clock signal PLL_CLK. In general, the clock signal PLL_CLK produced by the PLL 202 includes jitter. Each system 200 and 220 includes a phase noise measurement unit 216 for measuring the phase noise between the oscillator reference clock signal OSC_CLK and the PLL clock signal PLL_CLK.

In the system 200 of FIG. 2A, the phase noise measurement signal produced by unit 216 is provided to a phase correction unit 214 which receives the PLL clock signal PLL_CLK and produces a phase-corrected clock signal based on the phase noise measurement signal. In particular, the phase correction unit 214 may produce a corrected clock signal corresponding to the PLL_CLK signal and having the phase noise indicated in the phase noise measurement signal removed therefrom. In the system 200, the phase-corrected clock signal produced by unit 214 is provided to the clock input 218 of demodulator 201, such that the demodulator 201 demodulates the received RF input signal using the phase-noise corrected clock.

In the system 220 of FIG. 2B, the phase noise measurement signal produced by unit 216 is provided to a sample correction unit 212. In the system 220, the noisy PLL clock signal PLL_CLK is provided to the clock input 218 of demodulator 201, such that the demodulator 201 demodulates the received RF input signal using the noisy PLL clock signal. The sample correction unit 212 coupled to the output 219b of the demodulator 201 receives the demodulation signal from demodulator 201, and corrects the demodulation signal based on the phase noise measurement signal from unit 216, such that a phase-noise corrected signal is output by the correction unit 212.

In the system 200 of FIG. 2A, the phase correction unit 214 and demodulator 201 may be part of a sampling circuit (shown as "sampling circuit 1") configured to convert a data signal received at antenna 204 into an output data signal at sampling circuit outputs 220a. In the system 220 of FIG. 2B, the demodulator 201 and sample correction unit 212 may be part of a similar sampling circuit (shown as "sampling circuit 2") configured to convert a data signal received at antenna 204 into an output data signal at sampling circuit output 220b. The sampling circuits receive the PLL_CLK signal and the phase noise measurement signal, and convert the received data signal into the output data signal based on the PLL clock signal and the phase noise signal.

Figure 2C:
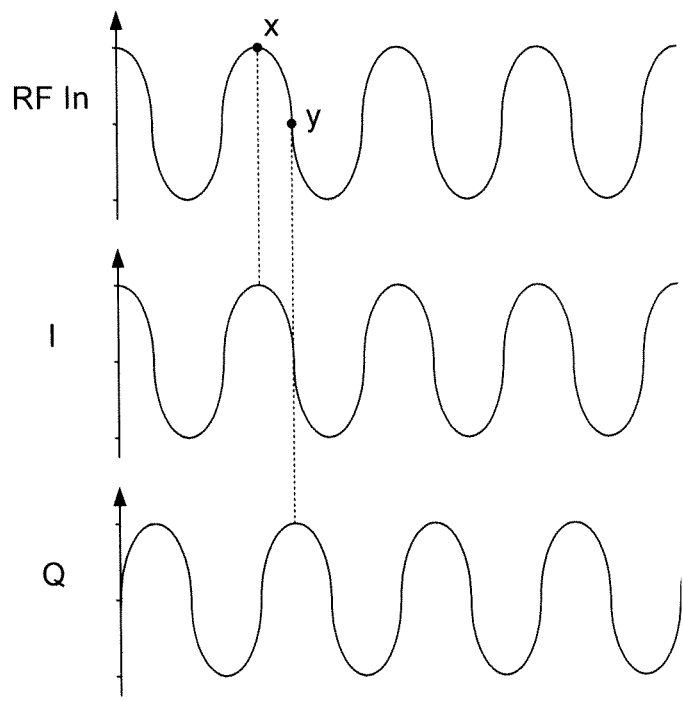
FIGS. 2C and 2D are timing diagrams of signals received in a quadrature mixer.
Figure 2D:
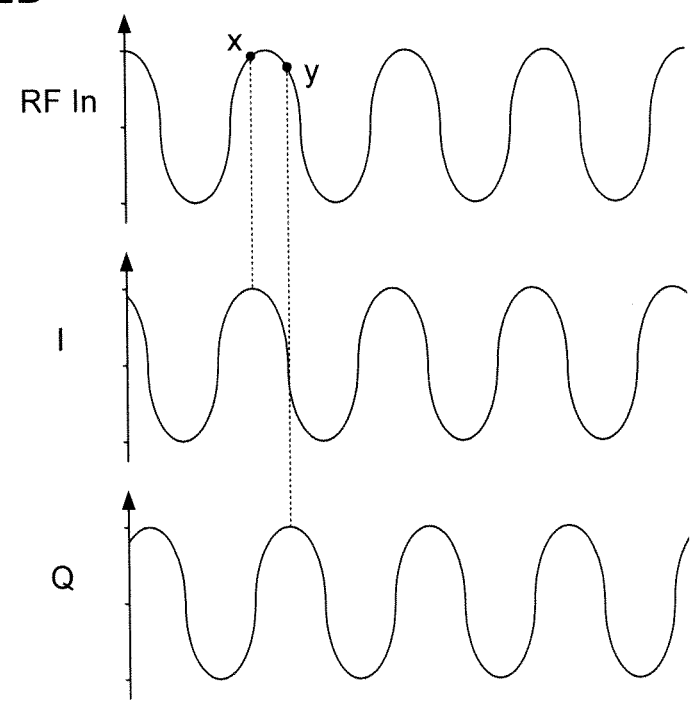
Figure 2E:
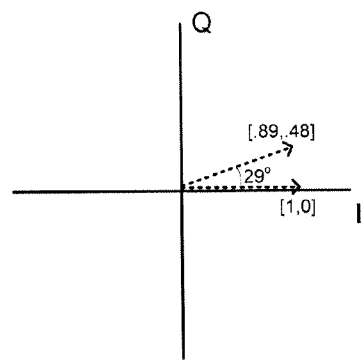
FIG. 2E is a constellation diagram showing the timing signals of FIGS. 2C and 2D.

FIG. 2C illustrates graphically the sampling of a quadrature mixer having I and Q local oscillator (LO) signals and an RF input without phase noise. Since the RF input is in phase with 1 and 90 degrees phase shifted with respect to Q, the vector projection of the RF signal into the constellation will be [x, y] [1, 0]. FIG. 2D shows a snapshot of the same RF input signal this time with the I and Q signals phase shifted by -29 degrees (I and Q early) to represent a phase noise disturbance. The vector result is [x, y]=[0.89, 0.48]. The relative places of the two vector projections on the constellation are shown in FIG. 2E. Note that since the I/Q vectors are interpreted with respect to the (shifted) I and Q basis functions the phase noise on the LO appears as a phase noise on the RF input signal even though the RF input signal is identical in both cases. If we were able to measure the relative phase shift of the I and Q sampling signals we could de-rotate the basis functions thereby removing the effect of phase noise from the down-converted signal. Note that generally the LO phase noise affects both I and Q channels similarly in terms of sampling delay. This is because the phase noise of the LO is generally much higher than the phase noise contribution of a divider or buffers used to generate the quadrature sampling signals.

The phase-noise induced jitter may be measured and corrected by comparing the LO clock signal PLL_CLK to the oscillator reference clock OSC_CLK using a phase noise measurement unit including a time-to-digital converter (TDC) and a temporal edge quantizer (TEQ). In some embodiments, the correction is done before sampling (see, e.g., system 200 of FIG. 2A). In other embodiments, the correction is done after sampling (see, e.g., system 220 of FIG. 2B).

Figure 3A:
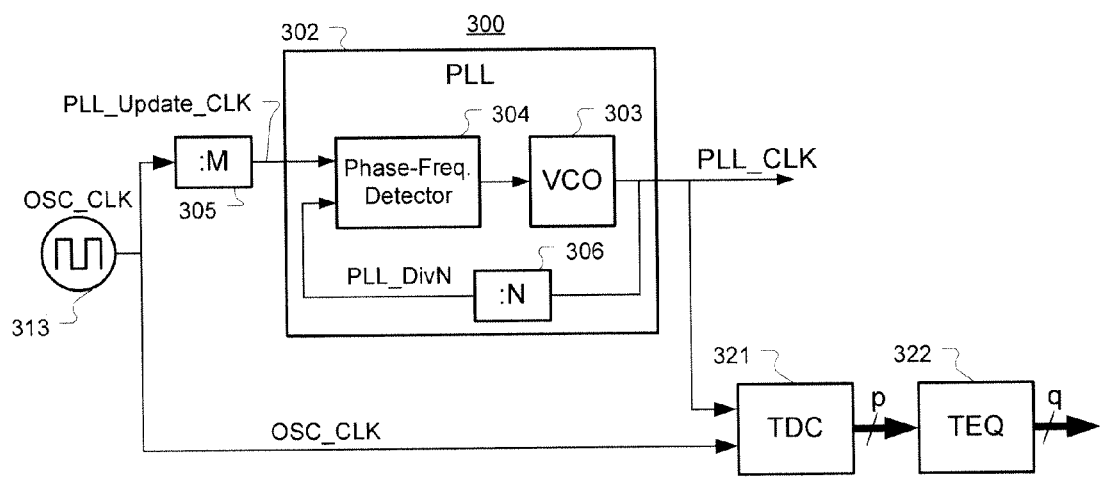
FIG. 3A is a block diagram of illustrative circuitry used to measure and correct phase-noise induced jitter.

FIG. 3A shows a block diagram of circuitry 300 used to measure and correct phase-noise induced jitter. The circuitry 300 includes an oscillator 313 providing a reference clock signal OSC_CLK used to provide a timing reference signal for a frequency stabilizer such as PLL 302. The reference clock signal OSC_CLK is optionally input into a frequency divider 305, which produces a PLL update signal PLL_Update_CLK at its output having a frequency M times lower than the frequency of the OSC_CLK signal. In general, M is an integer greater than 1; however, in some examples, M is non-integer. In circuits 300 in which a frequency divider 305 is used, the PLL_Update_CLK is provided at an input to PLL 302; in circuits in which a frequency divider 305 is not used, the OSC_CLK is provided at the input to PLL 302. The PLL 302 includes a phase-frequency detector 304, a VCO 303 producing a PLL clock signal PLL_CLK, and a divider 306 for reducing the frequency of the PLL clock signal PLL_CLK by an integer factor N before feeding the reduced frequency back to the phase-frequency detector 304. In some embodiments, the divider 306 may reduce the frequency of the PLL clock signal PLL_CLK by a ratio of integer factors K/N. In general, the frequency stabilizer such as PLL 302 produces a frequency stabilized clock signal shown as the PLL clock signal PLL_CLK having a frequency that is N times higher (or N/K times higher, where N and K are integers) than the frequency of the PLL_Update_CLK signal, corresponding to a frequency that is N/(M×K) higher than the frequency of the oscillator signal OSC_CLK. In examples in which a frequency divider 305 is present, the phase-frequency detector 304 performs phase comparison at a lower rate than the oscillator clock signal OSC_CLK (i.e., at a rate M times lower than the clock signal OSC_CLK).

In some embodiments, non-idealities in the frequency stabilizer or phase locked loop 302 (such as charge-pump leakage) cause the VCO output signal PLL_CLK to not line up perfectly with the reference clock edge at phase-frequency detector comparison instants. Circuitry 300 includes a phase noise measurement unit (such as unit 216 of FIGS. 2A and 2B). The phase noise measurement unit can include a TDC 321, a TEQ 322, and/or other processing circuitry. The TDC 321 measures the phase difference between signals presented to the inputs of the TDC. The TDC 321 receives the PLL clock signal PLL_CLK (or other frequency-stabilized signal at the output of the frequency stabilizer) and the oscillator clock signal OSC_CLK at respective inputs. Based on the received clock signals, the TDC produces one or more output signal(s) which are indicative of the phase error between the received clock signals. The TDC output signal(s) may be a signal having p-bits (p is an integer larger or equal to 1). The TEQ 322 and/or other processing circuitry processes the output signal(s) from the TDC to produce a phase noise measurement signal at its output. In some examples, the TEQ 322 and/or other processing circuitry may identify the timing of transitions in signal(s) received from the TDC, compare the timing of the transitions to baseline transition timing values, and determine whether the timing of the transitions changes over time based on the result of the comparison. In the examples, the TEQ 322 and/or other processing circuitry may output a phase noise signal indicative of the difference between the measured phase delay and the baseline phase delay. The signal output by the TEQ 322 and/or other processing circuitry may be a signal having q-bits, as shown in FIG. 3A (q is an integer larger or equal to 1).

Figure 3B:
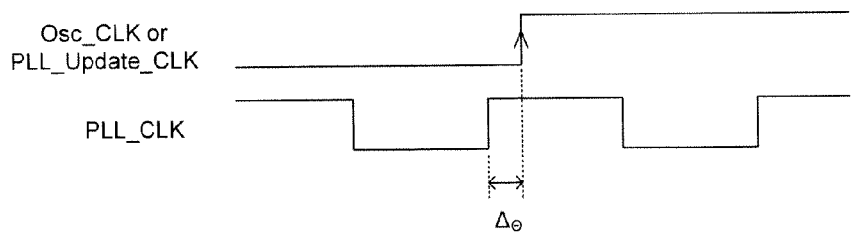
FIG. 3B is a timing diagram of illustrative signals propagating in the circuitry of FIG. 3A.

FIG. 3B illustratively shows a timing diagram showing the oscillator clock signal OSC_CLK and PLL clock signal PLL_CLK. The TDC 321 measures the phase noise, shown as $\Delta_\theta$ in the timing diagram, between rising edges in the OSC_CLK and PLL_CLK signals. An exemplary structure of the TDC is shown in FIG. 3C.

Figure 3C:
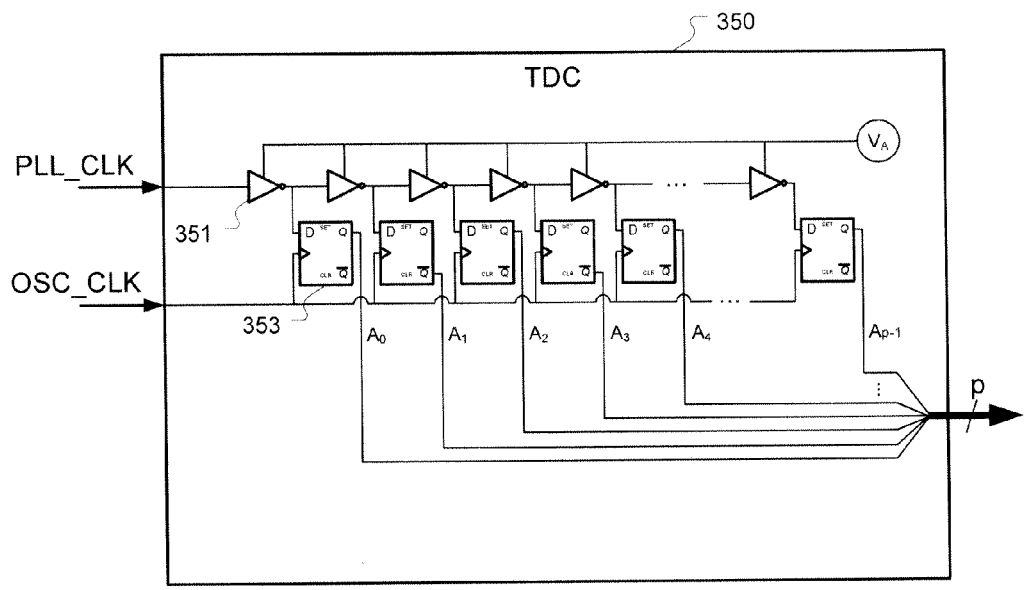
FIG. 3C is a block diagram of an illustrative time to digital converter (TDC).

FIG. 3C illustrates an embodiment of a TDC 350 suitable for compensation of phase noise. A string of p delay elements 351 (e.g., implemented in FIG. 3C as inverters) connected in series is driven by the PLL/VCO output signal PLL_CLK. Each delay element in the delay line has an output coupled to a corresponding one of p latches, and all the delay-line element outputs are simultaneously sampled by the line of latches. The latches are clocked by the reference clock signal OSC_CLK, such that each latch in the line of latches samples the corresponding delay element output on edges of the reference clock signal OSC_CLK (e.g., on rising edges, falling edges, or both rising and falling edges of the reference clock signal). The latch samples $A_0, A_1, \ldots, A_{p-1}$ are output as a signal of width p including all of the samples. The latch samples provided by the TDC can then be used to determine an approximate phase delay between the PLL_CLK signal and the OSC_CLK signal based on the pattern of latched samples. In general, each delay element in the string has a same delay period, which may be adjusted by varying a control signal such as the power supply voltage $V_A$ provided to the delay elements in the string.

Figure 3D:
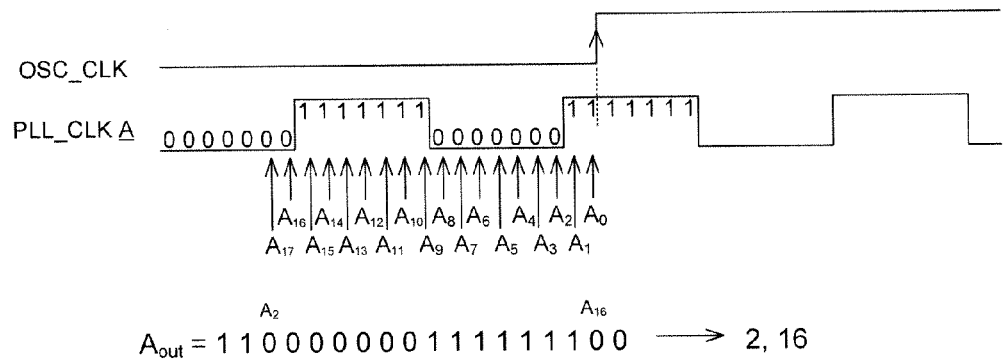
FIG. 3D is a timing diagram of illustrative signals propagating in the TDC of FIG. 3C.

FIG. 3D shows an illustrative timing diagram of signals in the TDC 350 of FIG. 3C. The timing diagram shows the PLL output signal PLL_CLK periodically alternating between low and high logic states. The PLL_CLK signal is fed through the string of delay elements 351. Each delay element in the string has a delay of length d. As such, the output of the first delay element in the chain reflects the value of the PLL_CLK signal at a time d prior to the current time, the output of the second delay element in the string reflects the value of the PLL_CLK signal at a time 2*d prior to the current time, and the output of the $(p-1)^{th}$ delay element in the string reflects the value of the PLL_CLK signal at a time (p−1)*d prior to the current time. In the example shown in FIG. 3D, the delay d is of approximately 1/14 times the period of the PLL_CLK signal such that the delay of 14 elements in the string correspond to one period of the PLL_CLK signal. In the example, p=18. When a rising edge of the oscillator clock signal OSC_CLK is received, the rising edge causes the string of latches 353 to sample and store the output values of the corresponding delay elements 351 in the string of delay elements. As shown in FIG. 3D, the latches $A_0$ through $A_{17}$ may store values $A_{out}=(A_0, A_1, A_2, A_3, A_4, A_5, A_6, A_7, A_8, A_9, A_{10}, A_{11}, A_{12}, A_{13}, A_{14}, A_{15}, A_{16}, A_{17})=(1, 1, 0, 0, 0, 0, 0, 0, 0, 1, 1, 1, 1, 1, 1, 1, 0, 0)$. The values $A_{out}$ are provided by the TDC 321 to the TEQ 322. The temporal edge quantizer (TEQ) looks for PLL_CLK edge transitions in the sampled TDC output and outputs a value representative of the tap(s) at which a transition occurs. In various embodiments 0→1 transitions are marked; 1→0 transitions are marked; all transitions are marked; all transitions are marked wherein the polarity of the transitions (1→0 or 0→1) are additionally marked. In the example, in response to receiving the values $A_{out}$, the TEQ detects the samples at which falling (1→0) transitions occurs. In this case, the TEQ identifies samples 2 and 16 as corresponding to falling transitions from a logic high "1" level to a logic low "0" level. In some embodiments, the TDC outputs p may be used directly for phase correction without a TEQ (e.g. parallel digital bits from output p may be XOR'ed with parallel digital bits representing a baseline).

In some embodiments, the integer-N PLL 302 locks the VCO 303 to the PLL_Update_CLK signal (or to oscillator clock signal OSC_CLK, in examples in which the divider 305 is not used). In an exemplary embodiment the PLL 302 operates at a 5 MHz phase-comparison rate to attain a channel spacing requirement, and the PLL has a bandwidth of 500 kHz. The 5 MHz clock is generated from a crystal oscillator 313 running at 20 MHz, and divided down by frequency divider 305 by a factor of M=4. The TDC 321 measures the time-delay characteristics between the VCO clock signal PLL_CLK and the 20 MHz reference clock signal OSC_CLK at every rising edge of the 20 MHz OSC_CLK clock cycle. The PLL 302 causes the phase of the VCO 303 to be DC stabilized with respect to the oscillator clock OSC_CLK; however, the edge of the VCO clock signal PLL_CLK generally is aligned to the reference clock signal OSC_CLK at the desired phase relationship only at those instants in time where the VCO is compared to the oscillator clock OSC_CLK (or PLL_Update_CLK) by the phase-frequency detector 304. In various embodiments, the phase of the PLL_CLK signal is aligned with the phase of the oscillator signal OSC_CLK; the PLL_CLK signal phase is aligned at an offset with respect to the oscillator reference OSC_CLK signal phase. In general, it is not necessary that the phase of the PLL_CLK signal align to any particular phase of the reference signal OSC_CLK, rather it is only desirable that the phase of the PLL_CLK signal be stabilized to the phase of the oscillator signal OSC_CLK in a DC sense such that the phase offset between the PLL_CLK and OSC_CLK signals remains constant in a DC sense (e.g. the phase offset of the VCO and reference may be 1 ns due to non-idealities in the PLL (leakage etc.) or phase delays otherwise within the system). Importantly, the PLL stabilizes the gross phase relationship between the oscillator signal OSC_CLK (or PLL_Update_CLK) and PLL output signal PLL_CLK so that the phase relationship between the PLL_CLK and OSC_CLK (or PLL_Update_CLK) signals nominally repeats at the comparison period (e.g. the phase relationship of the 20 MHz OSC_CLK clock edge in the period immediately following the comparison period will be nominally equal to the phase relationship of the 20 MHz OSC_CLK clock edge following the comparison period 200 ns later in time). Because the phase relationship between the OSC_CLK and the PLL_CLK signals is DC stabilized with respect to each other, variations from the nominal phase relationship may be measured and compensated for.

In the circuitry 300 of FIG. 3A, the TDC 321 continuously receives the PLL_CLK signal at one of its inputs, causing the PLL_CLK signal to continuously be propagated through the string of delay elements 351. To reduce the power consumption of the circuitry 300, a pulse generator can be used in conjunction with an "and" gate to only enable the TDC 321 for a limited period of time around the time that a measurement is needed (i.e., for a limited period of time around an edge transition in the OSC_CLK signal).

Figure 4A:
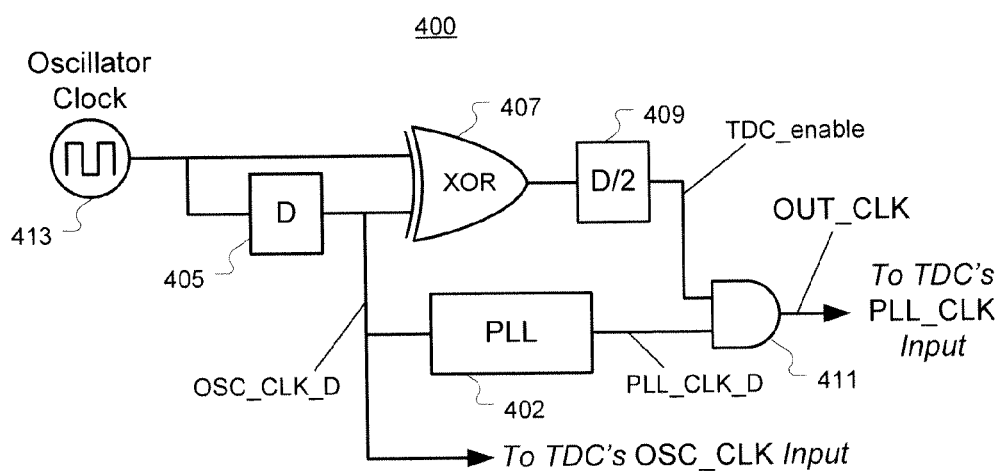
FIG. 4A is a block diagram of an illustrative circuit used to reduce the power consumption of a TDC.

FIG. 4A shows illustrative circuitry 400 for enabling the TDC only for the limited period of time. The circuitry 400 includes an oscillator clock 413 and a PLL 402 as in circuitry 300. In addition, circuitry 400 includes a first delay 405 of length D, an exclusive OR ("XOR") gate 407, a second delay 409 of length less than D (e.g., D/2), and an "AND" gate 411. The oscillator clock signal OSC_CLK is provided to one input of XOR gate 407, and through delay 405 to the other input of XOR gate 407. The signal at the output of XOR gate 407 is delayed by delay 409 for a period D/2, to produce a TDC_enable signal. In addition, the signal at the output of delay 405 (i.e., signal OSC_CLK_D corresponding to a delayed version of the OSC_CLK signal) is provided to the input of the PLL 402. In some embodiments the input to PLL 402 is taken directly from the oscillator clock, as opposed to a delayed version of the oscillator clock. The TDC_enable signal and the signal PLL_CLK_D at the output of the PLL 402 are provided to the "AND" gate 411. The output of the AND gate 411 produces the OUT_CLK signal, which is provided to the TDC's PLL_CLK input. The output of the delay 405 produces the OSC_CLK_D signal, which is provided to the TDC's OSC_CLK input. In some embodiments, the delay D is chosen to be greater than the time required for an edge to traverse the TDC register from $A_0$ to $A_{p-1}$.

Figure 4B:
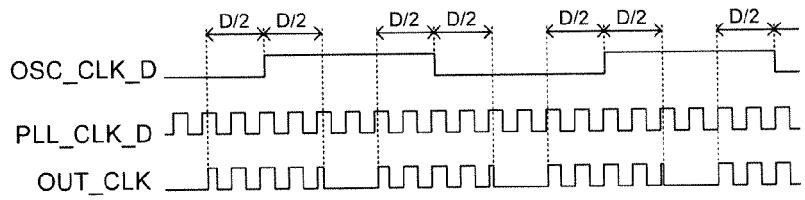
FIG. 4B is a timing diagram of illustrative signals propagating in the circuit of FIG. 4A.

FIG. 4B shows an illustrative timing diagram of signals produced by the circuitry 400. As shown in FIG. 4B, the circuitry 400 produces an OUT_CLK signal which remains in a logic low state during periods of time which are not around transitions in the OSC_CLK signal. The OUT_CLK signal, thus, corresponds to a gated version of the PLL_CLK signal during periods of time around transitions in the OSC_CLK signal. Specifically, the OUT_CLK signal is identical to the PLL_CLK_D signal (neglecting propagation delay of the "AND" gate) for a period of time beginning D/2 prior to each transition in a OSC_CLK_D signal, and ending D/2 after each transition in the OSC_CLK_D signal. The OUT_CLK and OSC_CLK_D signals can thus be used as inputs to a TDC while reducing the power consumption of the TDC. Such gating of the TDC to operate only when needed can save substantial power (e.g. enabling the TDC for 1 ns every 20 MHz cycle yields a TDC power consumption 50× lower than continuous operation.)

FIG. 5 shows an illustrative timing diagram showing timing signals used in a TDC. In the exemplary embodiment, the TDC is sampled at every edge of a 20 MHz reference clock signal OSC_CLK. A divided down version of the OSC_CLK signal, the PLL_Update_CLK signal, is provided at an input of the PLL (e.g., PLL 302 of FIG. 3A). A divided down version of the PLL_CLK signal, the signal PLL_DivN, has a period N times longer than the PLL_CLK signal period and is used to define a comparison period for the PLL. At each comparison period a phase detector (e.g., phase-frequency detector 304 of FIG. 3A) measures the difference in phase between PLL_DivN and PLL_Update_CLK. In some embodiments PLL_Update_CLK is derived from OSC_CLK by dividing OSC_CLK by a number M. In the example of FIG. 5, N=32, M=3. In particular, each rising edge transition in the PLL_DivN signal is used to determine the beginning of a comparison period. There are 6 edges in the OSC_CLK signal, spaced at 25 ns intervals (E0 through E5) shown between reference comparisons, yielding 6 sampled values $\Delta_{\theta 0}$, $\Delta_{\theta 1}$, $\Delta_{\theta 2}$, $\Delta_{\theta 3}$, $\Delta_{\theta 4}$, and $\Delta_{\theta 5}$ shown in FIG. 5. Each sampled value corresponds to a TDC output value $A_{out}$, and is provided to the TEQ to identify the sample value(s) at which edge transitions occur in the TDC output. To determine phase noise or jitter, each sampled value $\Delta_{\theta i}$ is compared with a baseline value corresponding to the relevant reference clock edge. Alternatively, instead of using the sampled value $\Delta_{\theta i}$, one or more TEQ values corresponding to each comparison are compared with baseline values corresponding to each of the relevant clock edges. For example, considering edge E2 shown in detail in the oval on the picture, there are PLL_CLK_D 0→1 transitions at TEQ sample values 7 and 17. If in the subsequent cycle (200 ns later) the TEQ reports transitions of 8 and 18, the TEQ determines that the PLL_CLK has shifted 1 unit delay early and can use this value of 1 unit delay to correct for the phase error, post sampling. Likewise, considering edge E4, if the TEQ reports transitions of 1 and 11 (compared with historical baseline values of 2 and 12) we will know that the VCO has shifted 1 unit delay late and can use this value to correct for the phase error, post sampling. Note that in the general case, each reference edge E0-E5 which samples the TDC has its own historical baseline value(s) (plural if multiple edges are compared for each comparison cycle) with which new samples are compared to determine the jitter.

The absolute phase relationship between the PLL_CLK signal and the reference OSC_CLK signal is not required; rather, only differences in the timing caused by jitter not otherwise compensated for by the PLL is considered when correcting the sampled values. The historical baseline value used for this comparison may be static, such as the first such value sampled by the TEQ for the corresponding transition; the historical baseline value may be the result of a filtered version of a series of TEQ measurements taken over time (for example the baseline value may be a low-pass filtered version of the TEQ output for the selected edge using a first-order digital filter having a bandwidth less than the comparison period). Digital logic may perform sanity checking to discard sampled data that is of questionable validity (e.g. caused by metastability in the latches, or sparkles in the output codes of the TDC). In general, there are multiple stored historical values of the VCO delay: one for each unique phase relationship between a VCO phase edge and an OSC_CLK edge. Since the pattern repeats every comparison cycle, the number of distinct values required for the example of FIG. 5 is 12 (i.e., 2 values for each of the 6 edges resulting from M=3 cycles of the PLL_Update_CLK): each reference edge captures two 0→1 VCO transitions via the TEQ, and there are six OSC_CLK edges captured (3 rising and 3 falling). More generally, the number of distinct values can be calculated as 2*2*M (corresponding to 2 values recorded for each rising edge occurring during M cycles of the OSC_CLK occurring during one period of the PLL_Update_CLK, and 2 values recorded for each falling edge during the same period). In various embodiments only like edges of the reference are considered (for example, only rising edges); a subset of reference edges are considered (for example, if an ADC samples at 10 MHz every other rising edge may be considered); a second, higher bandwidth PLL generates a reference clock for comparison of the VCO, the second reference clock being used as a reference to measure the phase noise of the VCO to be compensated; any other appropriate reference signal is used instead of OSC_CLK. Note that the TEQ provides jitter measurements at a rate of approximately 40 MHz (since the 20 MHz clock may have a non 50% duty cycle, which in some embodiments is measured and compensated for). Thus, the phase noise with energy up to 20 MHz may be removed from the post-sampled data. In some embodiments, rather than keeping multiple historical copies, a single historical baseline value may be kept. In this case, the additional historical baseline reference points for the 12 values of FIG. 5 being derived from the single historical baseline value by adding or subtracting the known expected phase relationship at the different reference edges. For example, if it is known, due to the PLL divider ratio, that the phase relationship of OSC_CLK to E0 is 3 delays smaller than the phase relationship of OSC_CLK to E1, and the TEQ baseline values for E0 are 5 and 15 then the baseline value of E1 may be calculated to be 5-3 and 15-3=2, 12. The second historical baseline values (e.g., 2, 12) can be derived from the known single historical baseline value (e.g., 5, 15). The nominal phase relationship is known amongst the VCO and the reference clock signal OSC_CLK since the frequency of the VCO and the frequency of the reference clock are known.

In some embodiments low-frequency phase noise (e.g. below the bandwidth of a low-pass filter used to construct a historical baseline TEQ value) is removed as part of the demodulation process thereby making low-frequency phase noise below a baseline phase delay filter irrelevant.

Figure 6A:
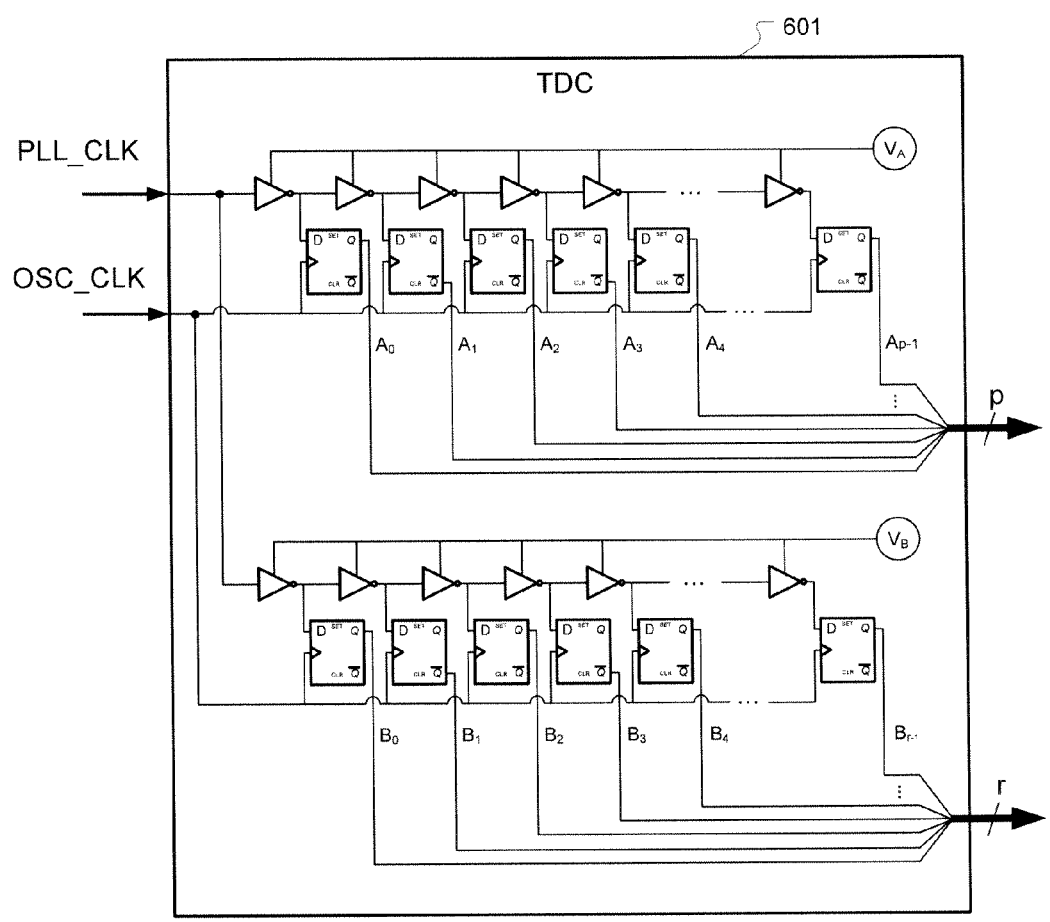
FIG. 6A is a block diagram of an illustrative TDC having two strings of inverters.

FIG. 6A illustrates an exemplary embodiment of a dual-string TDC 601. The dual-string TDC is similar in structure to the TDC 350 of FIG. 3C, but includes an additional series-interconnected string of r delay elements and of r corresponding latches forming a second delay line (r is an integer greater than 1). Each delay line takes as an input a signal to be measured, shown as PLL_CLK. The delay lines have latches along the length of the delay line, the latches being sampled when transitions in the reference clock OSC_CLK are detected. Delay element strings A and B have different unit-cell propagation delays, such that each delay element in string A has a delay $d_A$ and each delay element in string B has a delay $d_B$. In general, the delay periods $d_A$ and $d_B$ are different delay periods. The propagation delay in each string may be adjusted by varying the supply voltage $V_A$ or $V_B$ provided to the delay elements in the string, the sizes of devices in the string, a load capacitance of the delay elements (e.g. a varactor bias voltage), or any other appropriate parameter. In some embodiments in which inverters are used as delay elements, every other tap is taken from the inverter strings so that mismatch between rising and falling edges is not an issue. In an exemplary embodiment delay string A and delay string B comprise two nominally identical strings of delay elements with the desired difference in propagation delay arising from differences in the voltage applied to the supplies $V_A$ and $V_B$ as described later in this document in relation to FIGS. 7A and 7B. When a signal is sampled the two delay strings A and B will respectively each provide a p-bit-long and r-bit-long samples containing information about the relative phase of the signals OSC_CLK and PLL_CLK.

In some embodiments the delay of unit cells within the delay line is controlled by adjusting a control signal to a current-starved inverter comprising an inverter with at least one input to adjust the delay by varying the slew rate of the delay element. In some embodiments adjustable slew rate is accomplished by an additional NMOS transistor, PMOS transistor, or both NMOS and PMOS transistors coupled between the inverter and a ground or supply node, wherein a gate bias applied to the additional device adjusts the maximum current supplied by the inverter.

Figure 6B:
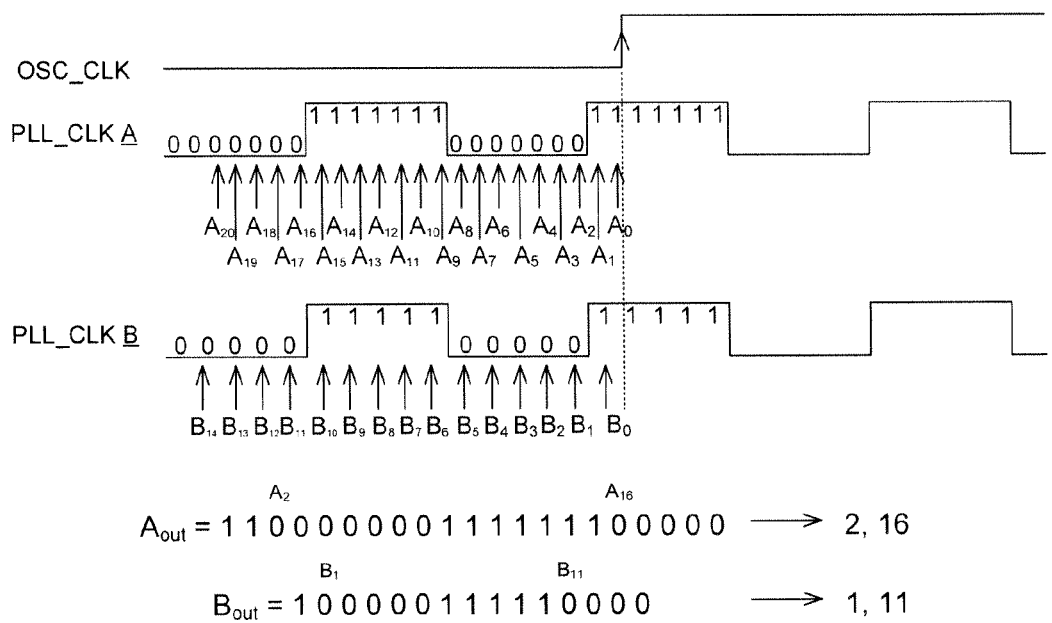
FIG. 6B is a timing diagram of illustrative signals propagating in the TDC of FIG. 6A.

FIG. 6B shows illustrative timing diagrams of signals in the dual tap TDC 601 of FIG. 6A. The timing diagram shows the PLL output signal PLL_CLK being fed through the string of delay elements A to produce the string of samples PLL_CLK_A, and being fed through the string of delay elements B to produce the string of samples PLL_CLK_B. When an edge transition is detected in the OSC_CLK signal, both the string of samples PLL_CLK_A and PLL_CLK_B are sampled by the corresponding latches to produce the outputs $A_0$ and $B_{out}$. In the example, the delay of each element in string A is approximately $\frac{1}{14}$ times the period of the PLL_CLK signal, while the delay of each element in string B is approximately $\frac{1}{10}$ times the period of the PLL_CLK signal. As a result, 14 samples are obtained in one period of the PLL_CLK_A signal, and 10 samples are obtained in one period of the PLL_CLK_B signal. The outputs $A_{out}$ and $B_{out}$ are provided to the TEQ, which identifies samples 2 and 16 as corresponding to falling transitions in the PLL_CLK_A signal, and identifies samples 1 and 11 as corresponding to falling transitions in the PLL_CLK_B signal. The phase noise measurement is determined based on the identified samples ([2, 16] and [1, 11]) according to the procedure described in relation to the example below.

In one example, suppose that PLL_CLK is a 5.8 GHz input signal and the TDCs are adjusted so that for string A, a full cycle of PLL_CLK stretches across 16 taps (each delay in string A representing 22.5 degrees (=360/16), the total TDC length capturing 1.5 PLL_CLK cycles over p=24 taps, or 540 degrees) and for string B, a full cycle of PLL_CLK stretches across 18 taps (each delay in string B representing 20 degrees (=360/18), the total TDC length capturing 1.5 PLL_CLK cycles over 27 taps, or 540 degrees). The outputs represent delay (in ps) as follows:

| TDC Tap # | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| String A | 11 | 22 | 32 | 43 | 54 | 65 | 75 | 86 | 97 | 108 | 119 | 129 | 140 | 151 | 162 | 172 | 183 | 194 | 205 | 216 | 226 | 237 | 248 | 259 |
| String B | 10 | 19 | 29 | 38 | 48 | 57 | 67 | 77 | 86 | 96 | 105 | 115 | 125 | 134 | 144 | 153 | 163 | 172 | 182 | 192 | 201 | 211 | 220 | 230 |

Suppose that the phase delay of the edge we are looking at was, in reality, at 123 ps. Then the output of the two TDCs would be as follows:

| TDC Tap # | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| String A | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 |
| String B | 0 | 0 | 0 | 1 | 1 | 1 | 1 | 1 | 1 | 1 | 1 | 1 | 0 | 0 | 0 | 0 | 0 | 0 | 0 | 0 | 0 | 0 | 1 | 1 |

Thus, we may reconstruct the relative phase as follows. Take the 1→0 transition on string A as a starting point; thus, string A tells us the edge occurs at tap 10, or 119 ps. However, the phase could be anywhere between 119 ps and 129 ps, the value of the next tap were only string A to be considered. Now considering string B we find that the phase is between 115 ps and 125 ps. Combining the information from string A and string B we find that the actual delay is between 119 ps and 125 ps, an uncertainty of 6 ps as compared to an uncertainty of 10 ps were only a single string to be considered. Further information may be gathered by comparing additional edge crossing data contained in the TDC sample. For example, we know that the last edge occurs between 18-19 for string A (205 ps to 216 ps) and 21-22 for string B (211 ps to 220 ps) thus the last edge must occur between 211 and 216 ps. Suppose that a running average value of the second edge occurs at an average value of 106 ps and the average value of the third edge occurs 190 degrees later (due to a non 50% PLL_CLK duty cycle) at 197 ps, then the first edge from above would say that Vin has shifted between [119 ps, 125 ps]−106 ps=[13 ps, 19 ps] and the second edge has shifted between [211 ps and 216 ps]−197 ps=[14 ps, 19 ps], thus the relative phase between Vin and Ref must be the intersection of these two sets which is between 14 ps and 19 ps; the actual phase being 123−106=17 ps, an error of 3 ps or less. Increased resolution of the TDC may be attained by increasing the delay element string length as well as monitoring additional edges. In some embodiments three or more strings of delay elements with different propagation delays $t_{pd}$ are used to construct a higher resolution TDC. In some embodiments an interpolation step is performed if the sets do not have an intersection. For example if string A yielded [8, 14 ps], and string B yielded [16 ps, 23 ps] then the relative phase may be estimated as (14+16)/2=15 ps even though 15 ps is not contained within either set. In some embodiments the delay of the various taps are operated upon in units of degrees of a nominal VCO cycle (as opposed to a time delay in ps.)

Figure 7A:
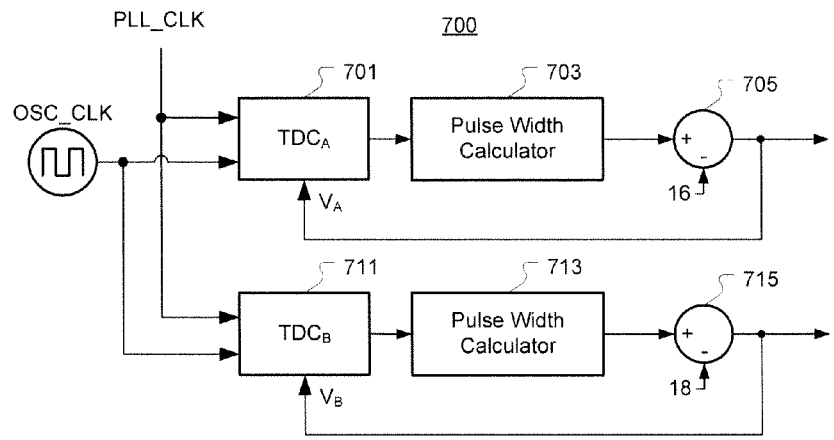
FIG. 7A is a block diagram of an illustrative circuit for controlling the operation of one or more TDCs.
Figure 7B:
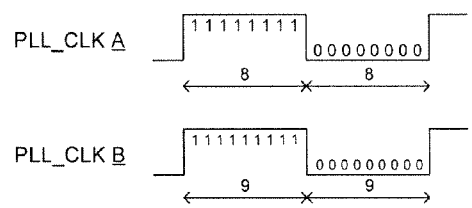
FIG. 7B is a timing diagram of illustrative signals propagating in circuit of FIG. 7A.

The control or supply voltages $V_A$ and $V_B$ of the two delay element strings A and B in the example of FIG. 6A may be set by a feedback loop as described below. Referring to FIG. 7A, the frequency of the PLL_CLK signal is set via a phase locked loop. FIG. 7A shows circuitry 700 used to set the supply voltage amplitudes $V_A$ and $V_B$ used to power the delay elements of respective delay element strings A and B of the dual tap TDC 601 of FIG. 6A. FIG. 7B shows illustrative clock signals produced by the circuitry 700. A first feedback loop including a first $TDC_A$ 701, a first pulse width calculator (PWC) 703, and a summer 705 is used to control the supply voltage $V_A$ provided to the delay element string A. In various embodiments a filter, a charge pump with a unity-gain buffer at the charge pump output, a DAC coupled to a voltage buffer having an output coupled to the delay-element string or combination thereof may be used in the feedback or forward path to adjust the loop bandwidth and/or compensate the loop dynamics. The $TDC_A$ 701 produces a signal $A_{out}$ as described previously which includes a string of zeros and ones representative of latched samples of a first string of delay elements. The PWC 703 receives the signal $A_{out}$, and determines the number of samples in one period of the PLL_CLK signal. The determined number of samples approximately corresponds to the ratio of the PLL_CLK period to the period of the delays in the delay element string. In one example, the PWC 703 determines the number of samples in one period by counting the number of samples between two rising-edge transitions in the signal $A_{out}$, or between two falling-edge transitions in the signal $A_{out}$. The summer 705 compares the number of samples output by the PWC 703 with a pre-set number of samples ("16" in the example of FIGS. 7A and 7B, corresponding to a pulse-width setpoint indicative of the number of periods of the delays in the delay element string that should fit within one period of the PLL_CLK signal): if the two numbers are equal, the supply voltage $V_A$ is maintained at its current amplitude; if the number of samples output by the PWC 703 exceeds the pre-set number, the supply voltage $V_A$ is reduced so as to make the delays in the delay string longer; and if the number of samples output by the PWC 703 is smaller than the pre-set number, the supply voltage $V_A$ is increased so as to make the delays shorter. An adjustable power supply circuit (e.g. a charge pump and a filter, the output of which is connected to an amplifier configured to supply power to the delay elements in the TDC, not shown) may be used to adjust the supply voltage $V_A$ based on the comparison result, so as to adjust the delay period of the delay elements of string A to a desired value. A second feedback loop including a second $TDC_B$ 711, a second pulse width calculator (PWC) 713, and a second summer 715 is similarly used to control the supply voltage $V_B$ provided to the delay element string B, and functions similarly to string A except with a different pre-set number. In some embodiments current-mode feedback is applied to the delay-element string (e.g. via a DAC having a current-mode output), with additional current being sourced from an adjustable current source to decrease the delay and less current being sourced from an adjustable current source to increase the delay.

In the description below, we will assume that string A should have a propagation delay of 22.5 degrees for each tap, and string B a propagation delay of 20 degrees for each tap. However, such values are illustrative of a particular example, and other values can be used. Given that string A is selected to have a propagation delay of 22.5 degrees for each tap, a period of the PLL_CLK signal should appear at the output of the TDC latches as a string of ones and zeros (which may be unequal due to duty cycle variations or other reasons) the sum of the length of the ones and zeros being 16 (16*22.5=360, as shown by signal PLL_CLK A in FIG. 7B). In other words, if we want 22.5 degrees between each tap, the entire PLL_CLK signal cycle should be captured in 16 taps. Thus, if the TDC output is monitored, a comparison may be made and the voltage $V_A$ adjusted according to well-known feedback-control techniques. If the delay of the taps is too short (i.e., the length of the PLL_CLK signal period is too long at the TDC output), then the supply voltage at the delay elements in the string is reduced. If the delay of the taps is too long (the length of the PLL_CLK signal period is too short at the TDC output), then the voltage at the delay elements in the string is increased. Likewise, string B has a separate loop that compares the length of the PLL_CLK signal period and drives the control or supply voltage $V_B$ so that the PLL_CLK signal period spans 18 TDC output samples (as shown by signal PLL_CLK B in FIG. 7B). If the TDC string is chosen to ensure that nominally more than 360 degrees of the PLL_CLK signal may be captured then the feedback loop to control the propagation delay for the delay line may operate every time the reference is sampled without concern about the relative phase of the PLL_CLK signal to the reference signal OSC_CLK edge because the measurand for this feedback loop is the length of the PLL_CLK signal cycle. The relative phase or positioning of the PLL_CLK signal along the TDC delay line is generally immaterial to calculation of the proper feedback value for delay-line adjustment. In some embodiments the average of the length of a PLL_CLK signal cycle is constructed (via a digital IIR or FIR filter, or a discrete- or continuous-time filter operated in the analog domain based upon the output of 705 and 715) before being fed back to adjust the TDC delay string supply voltage. In some embodiments one or more filters having a low-pass characteristic (e.g. charge pump) are inserted in the feedback loop (e.g. after summers 705/715) thereby forming a delta-sigma modulator that drives over time the average timing delay error towards zero.

In some embodiments the phase error reported by the TEQ, in conjunction with historical baseline TEQ information, is filtered or interpolated. For example, an ADC samples an input signal at 100 MHz with a VCO locked to a 20 MHz quartz-crystal oscillator. The TEQ updates can be provided at a 20 MHz rate (or 40 MHz rate if both edges are used). The TEQ updates may apply a zero-order hold (ZOH) lasting 50 ns, wherein each TEQ update is applied directly to compensate five ADC samples for jitter. Alternately, a first-order hold (FOH) or interpolation may be used to estimate the phase noise trajectory between the TEQ updates so each ADC sample has a different jitter correction value. The ADC phase-noise information may be used to interpolate or extrapolate a correction value based upon the estimated phase error for the input signal measured by the ADC. For example a ramping-input signal sampled regularly will yield equally spaced ADC output codes. However, phase noise will cause the ADC output to vary from desired based upon the timing jitter and the signal ramp rate. A first-order correction may be applied by measuring the slope of the ADC output signals (ADC(k)−ADC(k−1))/dT, where dT is the nominal difference in time between ADC samples, multiplying the slope by the determined timing jitter, and subtracting the estimated timing error from the ADC output. In some embodiments ADC samples are not directly corrected, but rather operation on the ADC output is adjusted to compensate for the irregular sampling timing caused by clock jitter. For example, a discrete-Fourier-transform (DFT) uses actual timing data, corrected for timing jitter, to form a matrix of basis functions adjusted for the irregular timing to obtain a minimum-squared-error estimate of the spectral content of the ADC output given a perfect sampling clock.

In another embodiment a 33-stage ring oscillator is enclosed in a phase-locked loop which may be an integer-N, fractional-N or any other type of phase locked loop that causes the ring oscillator to track a desired OSC_CLK phase characteristic. The ring oscillator comprises a plurality of inverters (which may be differential or single-ended). The PLL drives the power supply of the inverters to the proper voltage to generate the proper frequency as determined by the PLL. The power supply voltage is simultaneously applied to a TDC comprising a string of 90 delay elements that is coupled to the PLL's VCO output. Because the TDC delay elements are replica biased to the ring-oscillator supply, the propagation delay of the TDC delay elements is closely matched to the propagation delay within the VCO. The delay elements' outputs are simultaneously sampled (latched) by a reference clock OSC_CLK when a phase comparison is desired. The output of the latches is decoded to yield the relative phase relationship between the PLL's clock signal PLL_CLK and the reference clock OSC_CLK at a rate equal to the reference clock OSC_CLK frequency, which in this case is 20 MHz. Because 90 stages are used in the TDC, the TDC covers 90/33*180=490 degrees of the PLL_CLK signal with a precision of 360/(33*2)=5 degrees. The scale factor of the TDC may be adjusted by adding or subtracting inverters from a main VCO loop while keeping the number constant in the TDC since the PLL will adjust the voltage for the VCO delay elements to match the desired frequency thereby affecting the TDC propagation delay accordingly.

In some embodiments a delay-locked-loop (DLL) locked to the PLL_CLK output is used to adjust a delay-line for use in time-to-digital conversion. The DLL locks a reference delay-line to one or more periods of the PLL_CLK thereby stabilizing the required voltage at a delay control node (e.g. supply). The delay control node is applied to a replica of the delay-line for use in time to digital conversion.

In some embodiments phase is measured for every ADC sample. In some embodiments the phase measurement is offset in time, for example if an ADC is sampled at 4 MHz, then the phase may be measured 50 ns before the ADC samples due to bandwidth/group delay through the path to the ADC input from the jitter-sensitive sampler. In some embodiments the phase is sampled at a rate higher than the ADC sample rate and the resulting phase samples are filtered to improve angular resolution or shape the phase noise measurement in a manner to more effectively allow subsequent removal.

In some embodiments the VCO can be made with say 33 stages and the TDC can be formed via two delay element strings, each string having a length of 90 delay elements and the input to the first and second strings being delayed by an amount so that there is approximately 50% of a unit propagation delay between the first and second strings thereby giving resolution of ½ as compared to that attained by a single string.

Phase noise may cause mixing of adjacent channels into the desired sampling bandwidth. To improve adjacent or alternate channel rejection, an ADC, a sampler, or a mixer with phase-noise compensation as described above may sample the baseband signals at a rate that ensures the alternate and adjacent channel signals are encompassed into the sampling bandwidth. By doing this, the effect of the phase noise on the adjacent and alternate channels is removed (thereby preventing aliasing) and any signals on these undesired channels may be digitally filtered out post-correction to ensure adequate rejection. For example, in a direct conversion 802.15.4 receiver, the occupied channel bandwidth is approximately +/−1 MHz with channels spaced at 5 MHz. If the ADC is sampled at 25 MHz, then the energy at the adjacent and alternate channels will be accurately recorded and may be removed via digital filtering.

Note that it is not required to use the specific TDCs described herein. Any appropriate TDC may be used.

Figure 8:
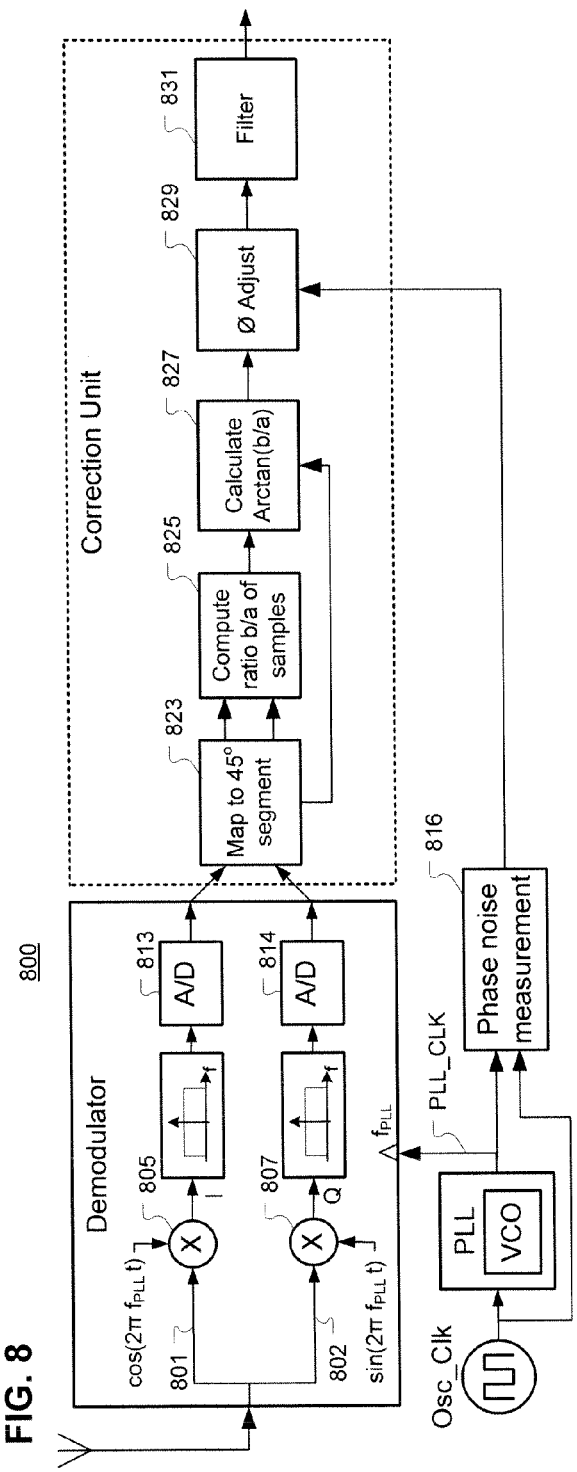
FIG. 8 is a block diagram of an illustrative system for providing phase noise tolerant sampling.

FIG. 8 illustrates a receiver 800 for use with a phase correction system as described herein. In some embodiments a passive mixer is coupled to the antenna directly or via a passive matching network. In some embodiments a low noise amplifier (LNA), low-noise-buffer, or other active circuit is inserted between the antenna and the mixer inputs. I and Q branches (illustratively shown at 801 and 802) propagate the received signal to be demodulated by mixers 805, 807, filtered, and provided to ADCs 813, 814 which sample the signals. The phase information being corrected is the mixer phase, wherein the mixers 805 and 807 use the clock signal PLL_CLK having phase noise. First a mapper 823 maps the I and Q signals to one of eight 45 degree segments around the unit circle taking into account the polarity of the I and Q signals, to thereby simplify subsequent trigonometric operations. The next block 825 divides b by a where b is the mapped Q component and a is the mapped I component. In some embodiments the mapping function takes the absolute value of I as a and the absolute value of Q as b. The division may be accomplished using a successive approximation technique and integer arithmetic to minimize power consumption. The resulting value is converted at 827 to an angle using an arctan look-up table, and adjusted based on the mapping operation performed by mapper 823. Next the phase noise and/or jitter error from the mixer sampling is subtracted in block 829 based on the output of the phase correction system (e.g., based on a phase noise measurement signal received from a phase noise measurement unit 816 including a TDC). An optional filter 831 then follows the corrected data which is then demodulated into chips and or symbols.

In some embodiments the I and Q signals are shifted in the time domain so that the I and Q values are placed without correction on the constellation, but the time associated with the sampled point is adjusted to reflect the actual time of sampling.

In some embodiments, for generic ADC sampling, a synthesized VCO samples the input signal. The jitter is measured by the techniques described above. The measured jitter is used to interpolate or extrapolate the measured ADC output to the correct value assuming a constant sample rate thereby removing the effects of jitter from the sampling operation.

In some embodiments, a TDC is used to measure the relative phase of I and Q signals by comparing the value of the TEQ outputs in response to sampling of I and Q mixer clock signals. Since the I and Q signals should nominally be spaced by 90 degrees and are fixed in relation to each other, the I and Q TEQ outputs for a given reference clock edge may be directly compared thereby yielding the relative phase information. This phase information may be used to trim the I and Q phase or used to correct for the non-orthogonality of I and Q in the digital domain, post sampling. In some examples, the blocks 823-831 of FIG. 8 may correspond to the correction unit 212 of FIG. 2B.

Figure 9B:
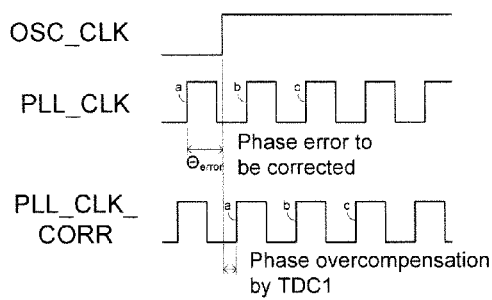
FIGS. 9B and 9C are timing diagrams of illustrative signals propagating in the system of FIG. 9A.
Figure 9C:
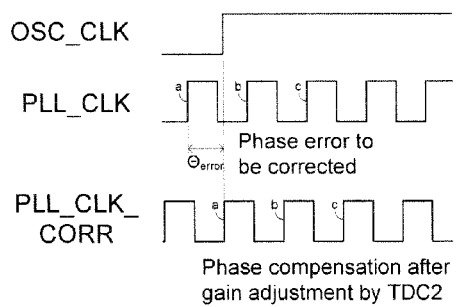
Figure 9A:
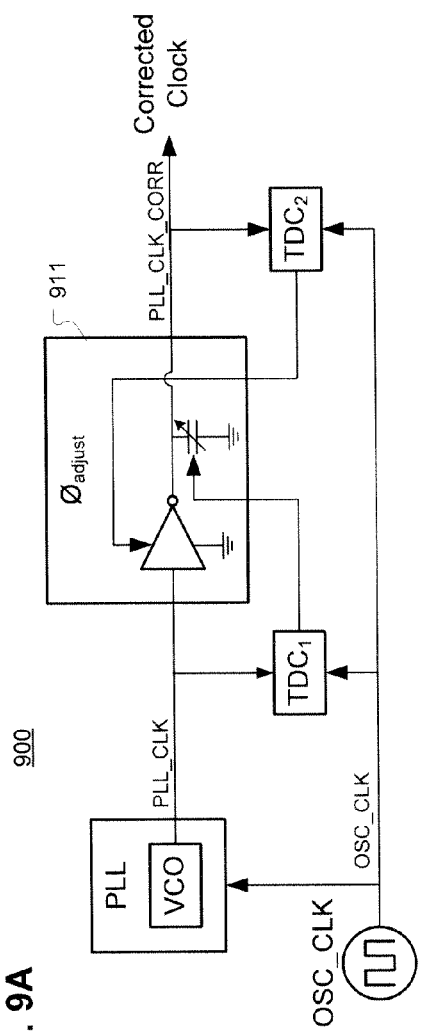
FIG. 9A is a block diagram of an illustrative system for removing phase noise from a clock signal.

FIG. 9A shows a detailed view of a phase correction unit 900, such as the phase correction unit 214 of FIG. 2A. In some embodiments phase error in a sampling clock PLL_CLK for an ADC, a DAC, or a mixer is compensated for as shown in FIG. 9A. A first TDC, TDC1 measures the difference between a reference edge of an oscillator clock signal OSC_CLK and an edge of the clock PLL_CLK to be corrected (e.g., the clock signal produced by VCO in a PLL to be used for sampling). The VCO output clock signal is connected to a variable delay element 911 having an output (for example, an inverter with a digitally controlled varactor array to effect adjustable delay, as shown). The variable delay element 911 delays the PLL clock signal by an adjustable delay determined based on the output of the TDC1. The output of the variable delay element is the corrected clock signal PLL_CLK_CORR which can be used to sample an ADC or a DAC (not shown). In addition to sampling, the variable delay element output PLL_CLK_CORR is connected to a second TDC (TDC2) that measures the corrected phase error between the PLL_CLK_CORR and OSC_CLK signals. While the TDC1 output is used to provide feed-forward cancellation of the phase error at the sampling clock output, the output of the TDC2 loop is used to adjust the scale factor (digital word in to delay output) so that the feed forward compensation provided by TDC1 more effectively removes phase errors. As shown, the output of TDC2 can be used to control a supply voltage provided to the variable delay element 911 thereby making the feed-forward cancellation in response to phase-noise measurements from TDC1 more efficacious. In alternate embodiments, the output of TDC2 can be used to control a supply voltage provided to the inverter forming part of the variable delay element. Thus, the variable delay element 911 delays the PLL clock signal by an adjustable delay determined based on the outputs of both TDC1 and TDC2. Feedback control techniques such as PID-control (proportional, integral, derivative control) may be realized by inserting a filter in the feedback loop comprising TDC2 thereby customizing the feedback portion of the loop from TDC2 to variable delay element 911 to optimize a response metric such as residual error, settling time, or closed-loop bandwidth.

FIGS. 9B and 9C are timing diagrams illustratively showing the phase error compensation provided by the phase correction circuit 900 of FIG. 9A. FIG. 9B shows the timing of signals prior to the circuit 900 reaching steady-state operation, while FIG. 9C shows the timing of signals once steady-state operation has been reached. As shown in FIG. 9B, at the reference edge, the PLL_CLK signal leads the reference clock OSC_CLK by $\theta_{error}$. The TDC1 measures this error and compensates for it by increasing the delay of the variable delay element 911. This results in a phase advancement shown in signal PLL_CLK_CORR of FIG. 9B, which overcorrects the $\theta_{error}$ by an amount shown. Since the desired phase shift is known (digital word input) and the actual phase shift is known (as measured by TDC2), the scale factor of the variable delay element may be adjusted (e.g., by increasing the supply voltage to the inverter to reduce the feed-forward scale factor, for example) to more precisely cancel the $\theta_{error}$. Thus, TDC2's output in conjunction with the feedback path to the variable delay element 911 adjusts the scale factor or gain of the variable delay element so that in subsequent samples the phase error cancellation applied based upon the output of TDC1 more precisely cancels the phase error of PLL_CLK, such that edges of the phase-corrected signal PLL_CLK_CORR line with edges of the reference signal OSC_CLK. FIG. 9C shows an illustrative timing diagram in which TDC2 has, over several samples, adjusted the scale factor or gain of the variable delay element, such that the edge of signal PLL_CLK_CORR is lined up with the edge of signal OSC_CLK.

In various embodiments a TDC is not used. In one embodiment the phase noise is measured by a phase detector suitable for a PLL coupled to a charge pump. The output of the charge pump represents integrated phase error and may be used directly (e.g. fed to a variable delay element to attenuate phase noise.) or may be quantized to allow correction for a sampled value after the fact.

In various embodiments a reference oscillator is formed using a quartz crystal, a BAW resonator, a SAW resonator, a micro-machined resonator formed by micromachining silicon or other appropriate material (e.g. a MEMS silicon resonator), a relaxation oscillator, a multivibrator, or any other suitable frequency reference.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A system comprising:
    a time to digital converter (TDC) comprising:
        a first series interconnection of a plurality of delay elements, wherein a first delay element of the first series interconnection receives a first timing signal at an input;
        a first plurality of latches, wherein each latch of the first plurality of latches has an input connected to an output of a respective delay element of the first series interconnection, and each latch of the first plurality of latches receives a second timing signal at a clock input;
        a second series interconnection of a plurality of delay elements, wherein a first delay element of the second series interconnection receives the first timing signal at an input; and
        a second plurality of latches, wherein each latch of the second plurality of latches has an input connected to an output of a respective delay element of the second series interconnection, and each latch of the second plurality of latches receives the second timing signal at a clock input; and
    processing circuitry coupled to the outputs of the first and second pluralities of latches and configured to determine an approximate phase delay between the first timing signal and the second timing signal based on outputs of the first and second pluralities of latches.

2. The system of claim 1, wherein each delay element of the first series interconnection has a first delay period, and each delay element of the second series interconnection has a second delay period different from the first delay period.

3. The system of claim 2,
    wherein each delay element of the first series interconnection is coupled to a first control signal,
    the system further comprising circuitry to adjust the first control signal connected to the delay elements of the first series interconnection.

4. The system of claim 3, wherein the delay element is coupled to the first control signal such that the first control signal is coupled to a power supply node for the delay element, such that the first control signal is coupled to a varactor coupled to a node within the delay element, or such that the control signal is coupled to a current starving input for the delay element.

5. The system of claim 3, wherein the circuitry to selectively adjust the first control signal comprises:
    a pulse width calculator coupled to the outputs of the first plurality of latches and configured to determine a pulse width of the first timing signal in units of the first delay period;
    a comparator configured to compare the determined pulse width with a desired pulse width and output a comparison result; and adjustable control signal circuitry for adjusting the first control signal based on the comparison result.

6. The system of claim 5,
wherein each delay element of the second series interconnection is connected to a second control signal,
the system further comprising:
    a second pulse width calculator coupled to the outputs of the second plurality of latches and configured to determine a second pulse width of the first timing signal in units of the second delay period;
    a second comparator configured to compare the determined second pulse width with a desired second pulse width and output a second comparison result;
    second adjustable control signal circuitry for adjusting the second control signal based on the second comparison result.

7. A system comprising:
a series interconnection of a plurality of delay elements, wherein a first delay element of the series interconnection receives a first timing signal at an input, and each delay element of the series interconnection has a first delay period and is coupled to a control signal;
a plurality of latches, wherein each latch of the plurality of latches has an input connected to an output of a respective delay element of the series interconnection, and each latch of the plurality of latches receives a second timing signal at a clock input; and
circuitry configured to selectively adjust the control signal coupled to the delay elements of the first series interconnection based on an output of the plurality of latches.

8. The system of claim 7, wherein the circuitry adjusts the control signal to obtain a desired first delay period.

9. The system of claim 7, wherein the circuitry adjusts the control signal such that a pre-determined number of first delay periods fit within a period of the first timing signal.

10. The system of claim 7, wherein the circuitry comprises:
a pulse width calculator coupled to the output of each of the plurality of latches and configured to determine a pulse width of the first timing signal in units of the first delay period;
a comparator configured to compare the determined pulse width with a pre-set pulse width and output a comparison result; and
adjustable control signal circuitry for adjusting the control signal based on the comparison result.

11. The system of claim 7, wherein:
the second timing signal has a frequency that is lower than a frequency of the first timing signal; and
the first delay period is shorter than a period of the first timing signal.

12. A system comprising:
a frequency stabilizer receiving a first reference clock at an input, and producing a frequency-stabilized signal at an output;
a phase noise measurement unit respectively receiving at first and second inputs a second reference clock and the frequency-stabilized signal, the phase noise measurement unit configured to produce a phase noise signal indicative of phase noise between the second reference clock and the frequency-stabilized signal; and
a sampling circuit configured to convert a first data signal into a second data signal, wherein the sampling circuit receives the frequency-stabilized signal and the phase noise signal, and converts the first data signal into the second data signal based on the frequency-stabilized signal and the phase noise signal.

13. The system of claim 12 wherein the frequency-stabilizer comprises a phase-locked-loop (PLL).

14. The system of claim 12, wherein the second reference clock signal is one of the first reference clock signal, a frequency divided version of the first reference clock signal, or a multiple of the frequency of the first reference clock signal.

15. The system of claim 12, wherein the sampling circuit is configured to convert the first data signal into the second data signal based on variations from a baseline phase delay in the phase delay between the second reference clock and the frequency-stabilized signal.

16. The system of claim 15, wherein the baseline phase delay is set using one of the following steps: filtering an output of the phase noise measurement unit; sampling an output of the phase noise measurement unit.

17. The system of claim 12, wherein the phase noise measurement unit comprises:
a time to digital converter (TDC) configured to measure a phase delay between the second reference clock and the frequency-stabilized clock signal; and
processing circuitry including a temporal edge quantizer (TEQ), the processing circuitry configured to compare the phase delay measured by the TDC with a baseline phase delay, and to produce the phase noise signal indicative of the difference between the measured phase delay and the baseline phase delay.

18. The system of claim 12, where the sampling circuit comprises:
a phase correction unit configured to receive the frequency-stabilized clock signal and the phase noise signal, and to produce a corrected clock signal corresponding to the frequency-stabilized clock signal having at least a portion of the phase noise indicated in the phase noise signal removed therefrom.

19. The system of claim 18, further comprising:
a time to digital converter (TDC) configured to measure a phase delay between the corrected clock signal and the second reference clock,
wherein the phase correction unit comprises a variable delay element configured to delay the frequency-stabilized clock signal by an adjustable delay determined based on the phase noise signal, and
wherein the phase correction unit is further configured to adjust a scale factor of the phase correction unit based on phase measurements of the TDC between the corrected clock signal and the second reference clock.

20. The system of claim 12, wherein the sampling circuit comprises:
a demodulator configured to receive the first data signal, and to produce a demodulation signal by demodulating the first data signal using the frequency-stabilized clock signal; and
a sample correction unit configured to receive the demodulation signal, and to produce the second signal by correcting the sampling phase of the demodulation signal based on the phase noise signal.

21. The system of claim 20, where the sample correction unit comprises:
circuitry for determining a phase angle associated with each of a series of samples of the demodulation signal; and
circuitry for adjusting the phase angle of each of the series of samples of the demodulation signal based on corresponding phase delay measurements received as part of the phase noise signal, and for outputting the second signal.

22. A method comprising steps of:
  generating a PLL clock signal in a phase-locked loop (PLL) receiving an oscillator clock signal;
  measuring a phase between the PLL clock signal and the oscillator clock signal;
  comparing the measured phase with a baseline phase, and producing a phase noise signal indicative of the difference between the measured phase and the baseline phase;
  converting a first data signal into a second data signal using the PLL clock signal and the phase noise signal.

23. The method of claim 22, wherein the converting the first data signal into the second data signal comprises:
  producing a corrected clock signal based on the PLL clock signal and having at least a portion of the phase noise indicated in the phase noise signal removed therefrom; and
  demodulating the first data signal using the corrected clock signal to produce the second data signal.

24. The method of claim 23, further comprising:
  measuring a second phase between the corrected clock signal and the oscillator clock signal,
  wherein the step of producing the corrected clock signal comprises producing the corrected clock signal corresponding to the PLL clock signal and having at least a portion of the phase noise indicated in the phase noise signal and the measured second phase removed therefrom.

25. The method of claim 24, wherein the step of producing the corrected clock signal comprises:
  delaying the PLL clock signal by an adjustable delay determined based on the phase noise signal and the measured second phase.

26. The method of claim 22, wherein the converting the first data signal into the second data signal comprises:
  producing a demodulation signal by demodulating the first data signal using the PLL clock signal; and
  producing the second signal by correcting the demodulation signal based on the phase noise signal.

27. The method of claim 26, wherein the correcting of the sampling of the demodulation signal comprises:
  determining a phase angle associated with each of a series of samples of the demodulation signal;
  adjusting the phase angle of each of the series of samples of the demodulation signal based on corresponding phase measurements received as part of the phase noise signal; and
  producing the second signal as a series of samples of the demodulation signal having phase angles adjusted based on the corresponding phase measurements.

* * * * *